United States Patent
Liou et al.

(10) Patent No.: US 9,772,557 B2
(45) Date of Patent: Sep. 26, 2017

(54) ILLUMINATION SYSTEM AND METHOD OF FORMING FIN STRUCTURE USING THE SAME

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 150 days.

(21) Appl. No.: 14/714,357

(22) Filed: May 18, 2015

(65) Prior Publication Data
US 2016/0299433 A1    Oct. 13, 2016

(30) Foreign Application Priority Data
Apr. 7, 2015  (CN) .......................... 2015 1 0160096

(51) Int. Cl.
*G03F 7/20*  (2006.01)

(52) U.S. Cl.
CPC ............ *G03F 7/203* (2013.01); *G03F 7/2002* (2013.01); *G03F 7/7025* (2013.01); *G03F 7/70091* (2013.01); *G03F 7/70125* (2013.01)

(58) Field of Classification Search
CPC ...... G03F 7/7025; G03F 7/70091; G03F 7/70; G03F 7/2002; G03F 7/203
USPC ....................................................... 355/67, 71
See application file for complete search history.

(56) References Cited

U.S. PATENT DOCUMENTS

| | | | |
|---|---|---|---|
| 7,446,858 B2 | 11/2008 | Kudo | |
| 7,517,642 B2 | 4/2009 | Liu | |
| 8,259,290 B2 | 9/2012 | Toyama | |
| 8,416,393 B2 | 4/2013 | Wang | |
| 8,632,930 B2 | 1/2014 | Hsu | |
| 8,644,589 B2 | 2/2014 | Hsu | |
| 8,908,151 B2 | 12/2014 | Muramatsu | |
| 2002/0152452 A1 | 10/2002 | Socha | |
| 2005/0046945 A1 | 3/2005 | Hwang | |
| 2007/0178411 A1* | 8/2007 | Setta | G03F 7/70091 430/311 |
| 2008/0297753 A1 | 12/2008 | Wang | |
| 2010/0165317 A1* | 7/2010 | Wallace | G03B 27/72 355/71 |
| 2013/0057844 A1 | 3/2013 | Patra | |

* cited by examiner

*Primary Examiner* — John A McPherson
(74) *Attorney, Agent, or Firm* — Winston Hsu

(57) ABSTRACT

An illumination system includes a light source used to generate a light and an opaque plate. The opaque plate is disposed between the light source and a photomask and includes an annular aperture and an aperture dipole. The annular aperture has an inner side and an outer side. The aperture dipole includes at least one first aperture and at least one second aperture. The first aperture and the second aperture connected to the annular aperture respectively and protruding out from the outer side of the annular aperture are disposed symmetrically with respect to a center of the annular aperture.

16 Claims, 9 Drawing Sheets

US 9,772,557 B2

ILLUMINATION SYSTEM AND METHOD OF FORMING FIN STRUCTURE USING THE SAME

BACKGROUND OF THE INVENTION

1. Field of the Invention

The present invention relates to an illumination system and a method of forming a fin structure using the illumination system, and more particularly, to an illumination system using an opaque plate including an annular aperture and an aperture dipole as a pupil and a method of forming a fin structure using the same.

2. Description of the Prior Art

With the advancements of semiconductor manufacturing technology, the scale of an integrated circuit is reduced and its operating rate is also faster. In the manufacturing process of the integrated circuit, the key to the technology is the photolithography process, which is responsible for accurately transferring the pattern in a photomask to the various device layers on wafer. In the photolithography process, the pattern in the photomask is mainly projected on a photoresist on the wafer by using an exposure device, so that the resolution of the pattern formed on the wafer, which is called critical dimension (CD), is determined by the exposure device. Since the exposure device transfers the pattern on the photoresist through projection, the reasons to determine CD are the illumination system and a wavelength of the light generated from the illumination system of the exposure device. Accordingly, it's always a task in this field to continuously improve the illumination system to reduce CD.

SUMMARY OF THE INVENTION

It is therefore an objective of the present invention to provide an illumination system and a method of forming a fin structure using the same to increase an incident angle of an exposing light to a photomask and effectively reduce CD.

According to an embodiment of the present invention, an illumination system is provided. The illumination system includes a light source used to generate a light and an opaque plate disposed between the light source and a photomask. The opaque plate includes an annular aperture and a first aperture dipole. The annular aperture has an inner side and an outer side. The first aperture dipole includes at least one first aperture and at least one second aperture, wherein the first aperture and the second aperture are connected to the annular aperture respectively and protrude out from the outer side of the annular aperture, and the first aperture and the second aperture are disposed symmetrically with respect to a center of the annular aperture.

According to another embodiment of the present invention, a method of forming a fin structure using an illumination system is provided. First, the illumination system is provided, wherein the illumination system includes a light source used to generate a light and an opaque plate. The opaque plate includes a first annular aperture having a first inner side and a first outer side and a first aperture dipole including at least one first aperture and at least one second aperture. The first aperture and the second aperture are connected to the first annular aperture respectively and protrude out from the first outer side of the first annular aperture, and the first aperture and the second aperture are disposed symmetrically with respect to a first center of the first annular aperture and arranged along a first direction. Next, a first photomask, a plurality of annular spacers and a substrate are provided, wherein the annular spacers are disposed on the substrate, and the first photomask includes a plurality of first stripe-shaped openings extending along a second direction respectively. Subsequently, the first opaque plate of the illumination system is disposed between the light source and the first photomask, and the first direction is disposed to be perpendicular to the second direction. Then, a first mask layer is formed on the annular spacers. Thereafter, a first exposure process is performed with the illumination system and the first photomask to define positions of a plurality of first cutting openings in the first mask layer.

In the opaque plate of the present invention, the aperture dipole at least is disposed at the outer side of the annular aperture, so that the incident angle of the exposing light to the photomask after passing through the aperture dipole and the annular aperture can be increased, and the CD can be effectively reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
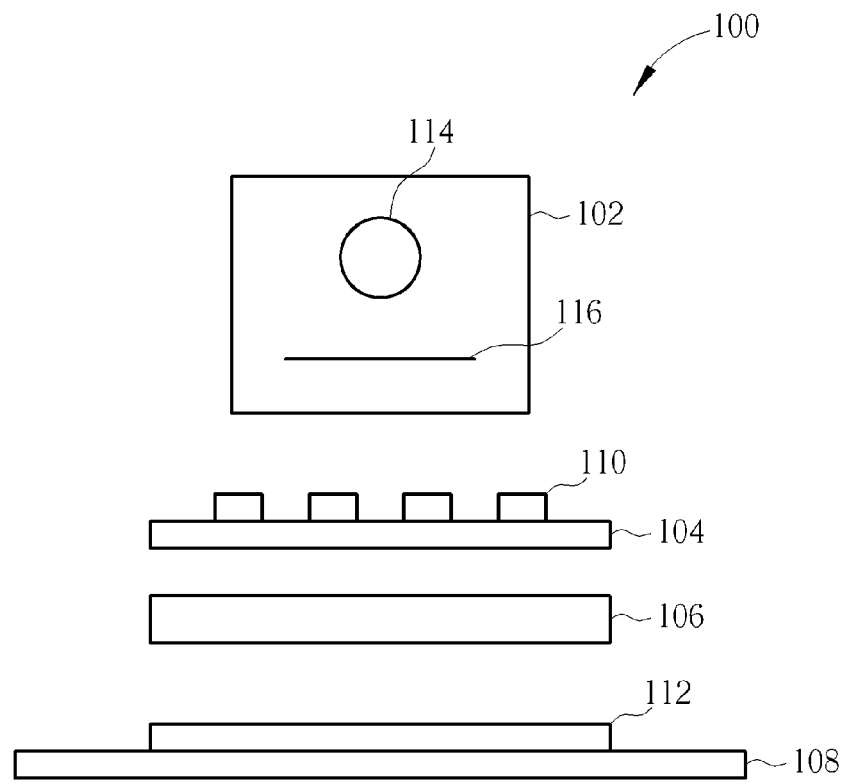
FIG. 1 illustrates an exposure device according to an embodiment of the present invention.

Refer to FIG. 1, which illustrates an exposure device according to an embodiment of the present invention. As shown in FIG. 1, the exposure device 100 of this embodiment includes an illumination system 102, a photomask holder 104, a projection lens 106 and a substrate holder 108. The illumination system 102 is used to generate an exposing light while the photomask holder 104, the projection lens 106 and the substrate holder 108 are disposed on a light path of the exposing light in order. During performing an exposure process, the photomask 110 and a substrate 112 desired to be patterned are disposed on the photomask holder 104 and the substrate holder 108 respectively, and the exposing light can pass through the photomask 110 and the projection lens 106 in order and then is focused on a photoresist layer on the substrate 112. The illumination system 102 includes a light source 114 and an opaque plate 116. The light source can generate the exposing light, such as KrF laser light with a wavelength of 248 nm or ArF laser light with a wavelength of 193 nm, but the present invention is not limited thereto. The opaque plate 116 is disposed between the light source 114 and the photomask 110 and has at least one aperture used as a pupil of the illumination system 102. Since that, the exposing light can form a desired pattern of light after passing the aperture of the opaque plate 116.

Figure 2:
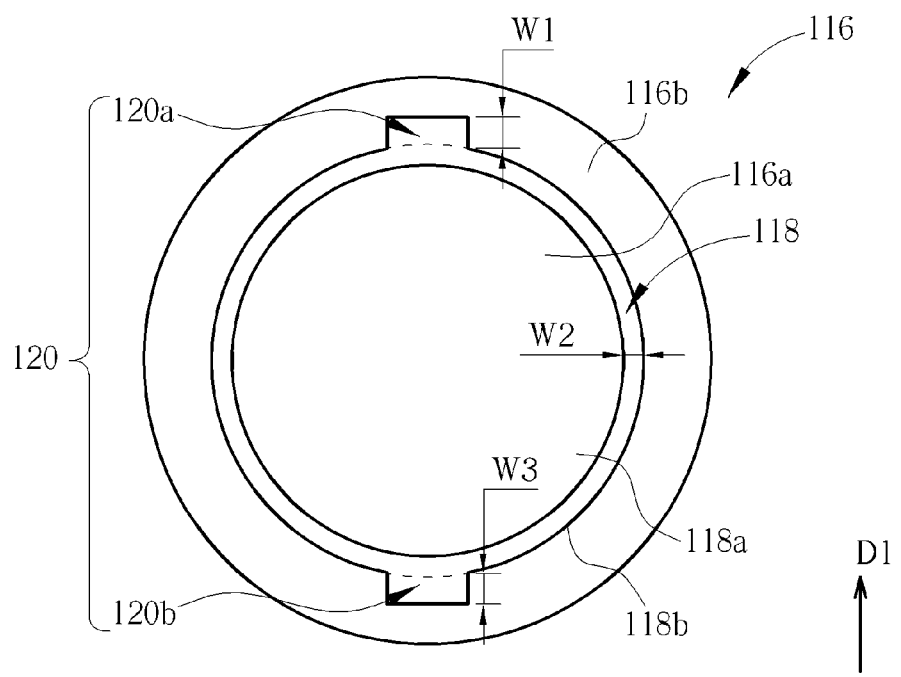
FIG. 2 illustrates a top view of the opaque plate according to the first embodiment of the present invention.

Refer to FIG. 2, which illustrates a top view of the opaque plate according to the first embodiment of the present invention. As shown in FIG. 2, the opaque plate 116 of this embodiment includes an annular aperture 118 and a first aperture dipole 120. The annular aperture 118 has an inner side 118a and an outer side 118b and surrounds a part of the opaque plate 116. Specifically, the opaque plate 116 may include a central portion 116a and a peripheral portion 116b, and the annular aperture 118 surrounds the central portion 116a. Accordingly, a shape of the central portion 116a is substantially the same as the inner side 118a of the annular aperture 118. For instance, the shape of the annular aperture 118 and the shape of the central portion 116a may be circular or elliptic. Also, the peripheral portion 116b surrounds the annular aperture 118 and the first aperture dipole 120, and the central portion 116a and the peripheral portion 116b form the annular aperture 118 and the first aperture dipole 120. The first aperture dipole 120 may include at least one first aperture 120a and at least one second aperture 120b. In this embodiment, the first aperture dipole 120 only includes a single first aperture 120a and a single second aperture 120b. The first aperture 120a and the second aperture 120b are connected to the outer side 118b of the annular aperture 118 and protrude out from the outer side 118b of the annular aperture 118 toward the peripheral portion 116b. Also, the first aperture 120a and the second aperture 120b are disposed symmetrically with respect to a center of the annular aperture 118, and the first aperture 120a and the second aperture 120b are arranged along a first direction D1. For example, a shape of the first aperture 120a and a shape of the second aperture 120b may be but not limited to polygonal such as square or rectangular, geometrical or nongeometrical, such as curve or arcuate, in which a side of the first aperture 120a and a side of the second aperture 120b are connected to the outer side 118b of the annular aperture 118. The present invention is not limited thereto. In another embodiment, a connection area between the first aperture and the annular aperture or between the second aperture and the annular aperture may be a corner of the polygonal aperture. In addition, when the shape of the annular aperture is elliptic, the first direction is preferably parallel to along axis of the annular aperture. In another embodiment, the first direction may be parallel to a short axis of the annular aperture or may not be parallel to the long axis and the short axis of the annular aperture.

It should be noted that the first aperture 120a and the second aperture 120b of the opaque plate 116 are totally disposed outside the outer side 118b of the annular aperture 118 in this embodiment, so that the incident angle of the exposing light to the photomask 110 after the exposing light passing through the first aperture 120a, the second aperture 120b and the annular aperture 118 can be increased as compared with the first aperture and the second aperture being disposed only at the inner side of the annular aperture 118 and denting toward the central portion 116a. Since a number aperture of the exposure device 100 is directly proportional to the incident angle of the exposing light to the photomask 110 and the number aperture is inversely proportional to critical dimension (CD), the increased incident angle can result in reduction of the CD effectively.

In addition, in this embodiment, a width W1 of the first aperture 120a in the first direction D1 is larger than a width W2 of the annular aperture 118. Similarly, a width W3 of the second aperture 120b in the first direction D1 is also larger than the width W2 of the annular aperture 118. Also, the width W1 may be the same as the width W3, so that the first aperture 120a may have the same size as the second aperture 120b. Accordingly, as compared with the brightness of the light passing through the annular aperture 118, the brightness of the light passing through the first aperture dipole 120 can be increased, which means the brightness of the light with increased incident angle is increased, thereby effectively reduce the CD.

The opaque plate of the present invention is not limited to the above-mentioned embodiment. The following description continues to detail the other embodiments or variants, and in order to simplify and show the difference between the other embodiments or variants and the above-mentioned embodiment, the same numerals denote the same components in the following description, and the same parts are not detailed redundantly.

Figure 3:
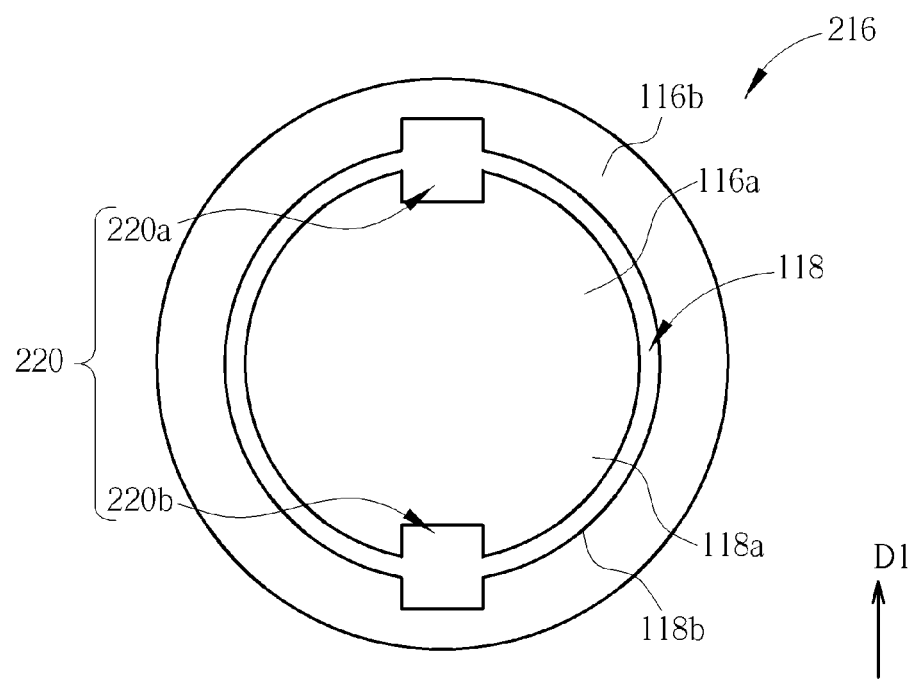
FIG. 3 illustrates a top view of an opaque plate according to a second embodiment of the present invention.

Refer to FIG. 3, which illustrates a top view of an opaque plate according to a second embodiment of the present invention. As shown in FIG. 3, each of the first aperture 220a and the second aperture 220b crosses a part of the annular aperture 118 respectively in the first aperture dipole 220 of the opaque plate 216 of this embodiment instead of being totally disposed outside the outer side 118b of the annular aperture 118 as compared with the first embodiment. That is, each of the first aperture 220a and the second aperture 220b dents from the inner side 118a of the annular aperture 118 toward the central portion 116a and also protrudes out from the outer side 118b toward the peripheral portion 116b, and the first aperture 220a may have the same size as the second aperture 220b.

Figure 4:
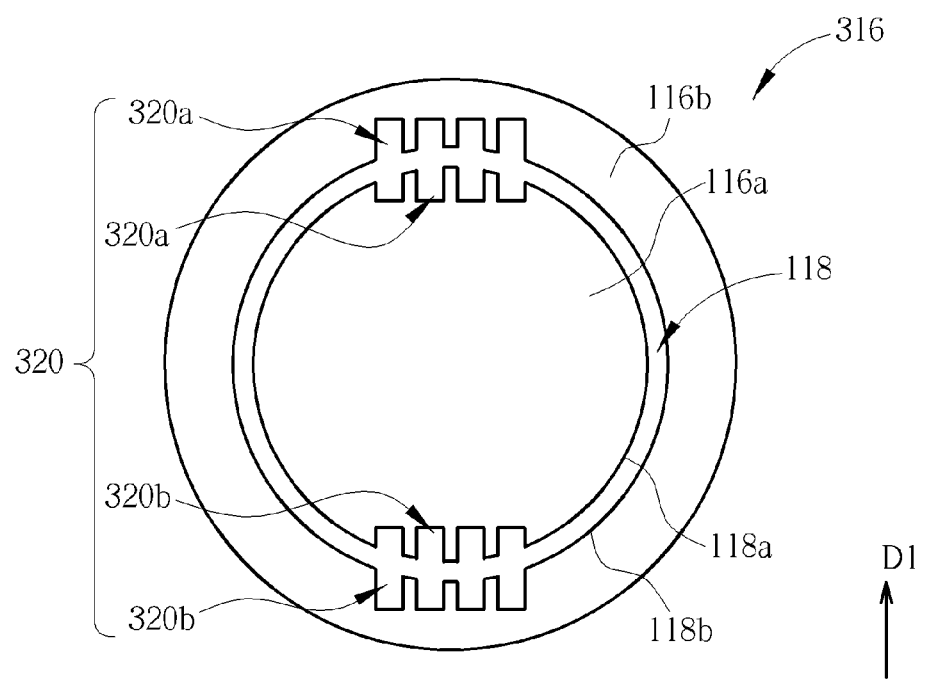
FIG. 4 illustrates a top view of an opaque plate according to a third embodiment of the present invention.

Refer to FIG. 4, which illustrates a top view of an opaque plate according to a third embodiment of the present invention. As shown in FIG. 4, the first aperture dipole 320 includes a plurality of first apertures 320a and a plurality of second aperture 320b in the opaque plate 316 of this embodiment as compared with the second embodiment. In this embodiment, the first apertures 320a and the second apertures 320b are disposed symmetrically with respect to the center of the annular aperture 118, and each of each first aperture 320a and each second aperture 320b crosses a part of the annular aperture 118 respectively. Each first aperture 320a may have the same size as each second aperture 320b. Accordingly, each of each first aperture 320a and each second aperture 320b respectively dents from the inner side 118a of the annular aperture 118 toward the central portion 116a and also protrudes out from the outer side 118b toward the peripheral portion 116b. The present invention is not limited herein. In another embodiment, each first aperture and each second aperture may only protrude out from the outer side of the annular aperture toward the peripheral portion instead of crossing the annular aperture, and each first aperture and each second aperture may be disposed outside the outer side of the annular aperture.

Figure 5:
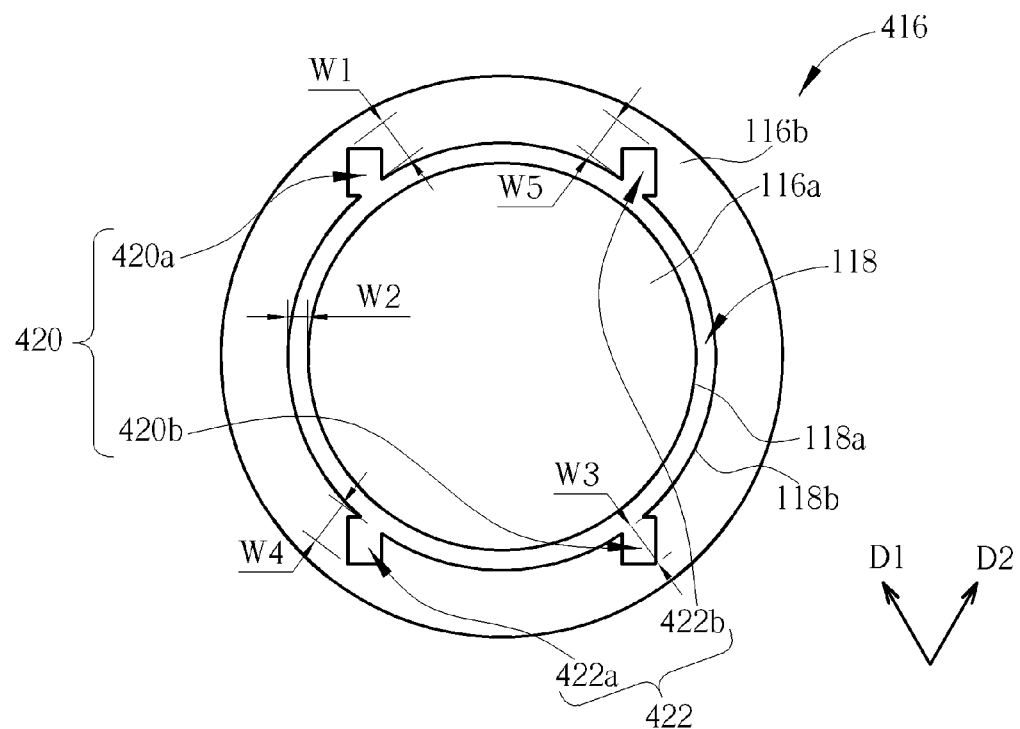
FIG. 5 illustrates a top view of an opaque plate according to a third embodiment of the present invention.

Refer to FIG. 5, which illustrates a top view of an opaque plate according to a third embodiment of the present invention. As shown in FIG. 4, the opaque plate 416 further includes a second aperture dipole 422 besides the first aperture dipole 420 including the first aperture 420a and the second aperture 420b in this embodiment as compared with the first embodiment. The second aperture dipole 422 includes a third aperture 422*a* and a fourth aperture 422*b*, wherein the first aperture 420*a*, the second aperture 420*b*, the third aperture 422*a* and the fourth aperture 422*b* are connected to the outer side 118*b* of the annular aperture 118 respectively and protrude out from the outer side 118*b* of the annular aperture 118 toward the peripheral portion 116*b* respectively. Also, the first aperture 420*a* and the second aperture 420*b* are disposed symmetrically with respect to the center of the annular aperture 118 and arranged along the first direction D1. The third aperture 422*a* and the fourth aperture 422*b* are disposed symmetrically with respect to the center of the annular aperture 118 and arranged along a second direction D2 different from the first direction D1. In this embodiment, an included angle between the first direction D1 and the second direction D2 is less than 90 degrees. For example, when the shape of the annular aperture 118 is elliptic, an arrangement direction of the first aperture 420*a* and the third aperture 422*a* and an arrangement direction of the second aperture 420*b* and the fourth aperture 422*b* may be parallel to the long axis of the annular aperture 118, and an arrangement direction of the first aperture 420*a* and the fourth aperture 422*b* and an arrangement direction of the second aperture 420*b* and the third aperture 422*b* may be parallel to the short axis of the annular aperture 118. Also, a shape and a size of the third aperture 422*a* and a shape and a size of the fourth aperture 422*b* may be the same as or different from that of the first aperture 420*a* and that of the second aperture 420*b* and may be rectangular or arcuate. In this embodiment, corners of the first aperture 420*a*, the second aperture 420*b*, the third aperture 422*a* and the fourth aperture 422*b* are connected to the outer side 118*b* of the annular aperture 118 respectively. Furthermore, the width W1 of the first aperture 420*a* and the width W3 of the second aperture 420*b* in the first direction D1 which are the same as each other may be larger than the width W2 of the annular aperture 118, and a width W4 of the third aperture 422*a* and a width W5 of the fourth aperture 422*b* in the second direction D2 which are the same as each other also may be larger than the width W2 of the annular aperture 118. In this embodiment, the width W1 and the width W3 may be the same as the width W4 and the width W5. In another embodiment, the width W1 and the width W3 may be different from the width W4 and the width W5.

Figure 6:
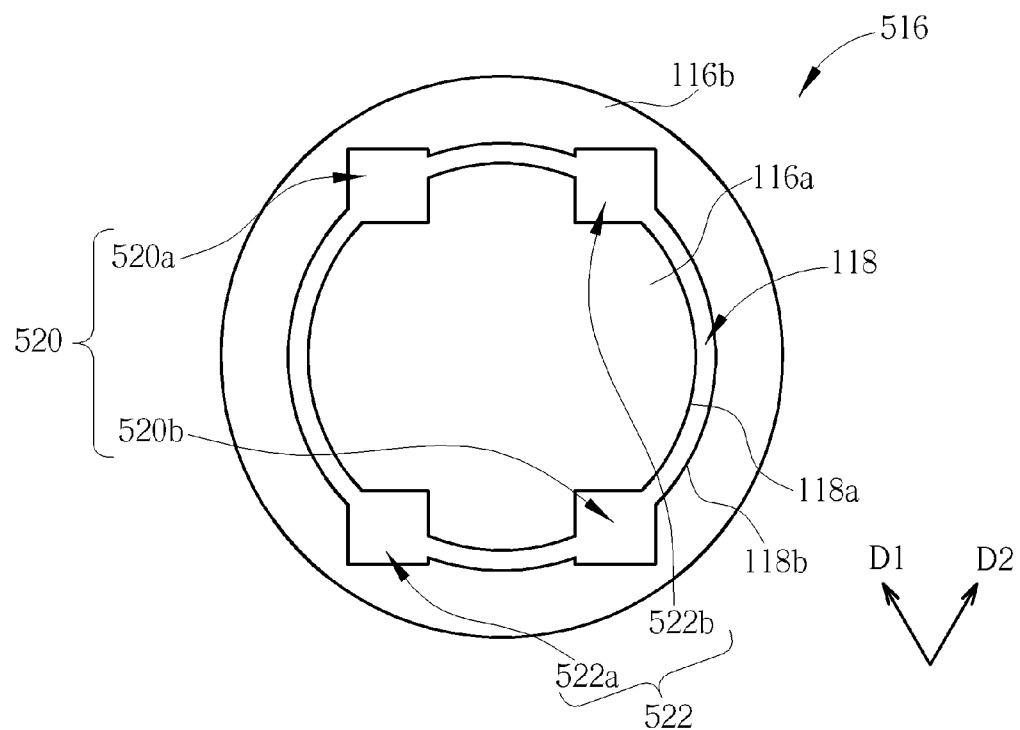
FIG. 6 illustrates a top view of an opaque plate according to a fifth embodiment of the present invention.

Refer to FIG. 6, which illustrates a top view of an opaque plate according to a fifth embodiment of the present invention. As shown in FIG. 6, each of the first aperture 520*a* and the second aperture 520*b* of the first aperture dipole 520 and the third aperture 522*a* and the fourth aperture 522*b* of the second aperture dipole 522 crosses a part of the annular aperture 118 in the opaque plate 516 of this embodiment as compared with the fourth embodiment. That is, each of the first aperture 520*a*, the second aperture 520*b*, the third aperture 522*a* and the fourth aperture 522*b* dents from the inner side 118*a* of the annular aperture 118 toward the central portion 116*a* and protrudes out from the outer side 118*b* toward the peripheral portion 116*b* respectively. Also, a part of each aperture denting toward the central portion 116*a* or protruding toward the peripheral portion 116*b* is a corner but is not limited herein, and may be a side in another embodiment. In this embodiment, the first aperture 520*a*, the second aperture 520*b*, the third aperture 522*a* and the fourth aperture 522*b* may have the same size. In another embodiment, the first aperture and the second aperture may have the same size, but have different sizes from the third aperture and the fourth aperture that have the same size.

Figure 7:
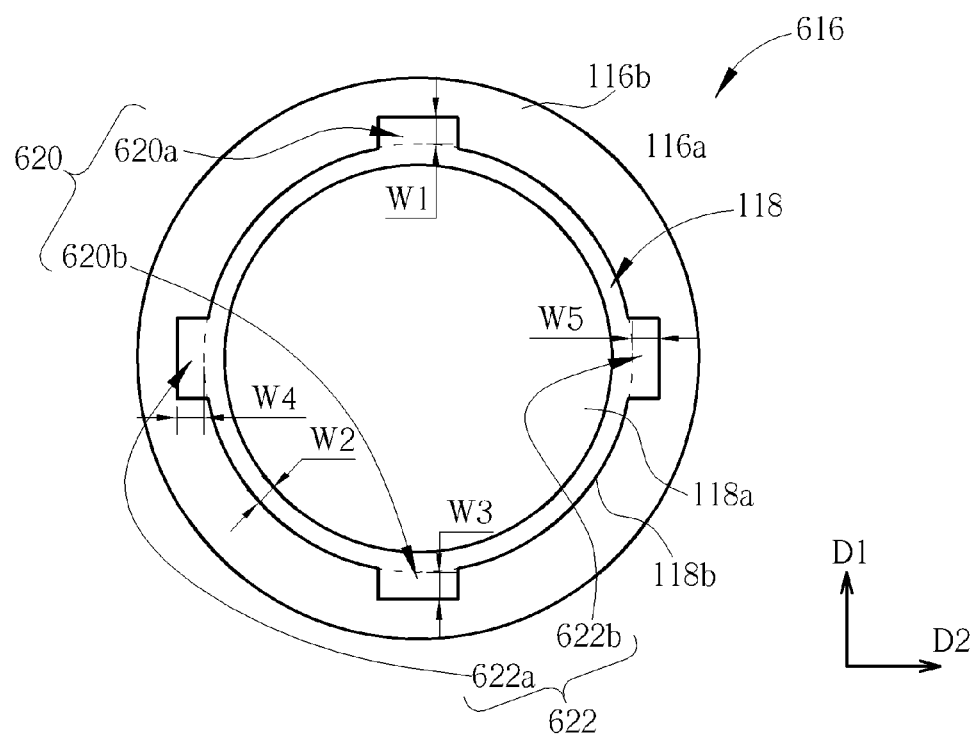
FIG. 7 illustrates a top view of an opaque plate according to a sixth embodiment of the present invention.

Refer to FIG. 7, which illustrates a top view of an opaque plate according to a sixth embodiment of the present invention. As shown in FIG. 7, the first direction D1 that the first aperture 620*a* and the second aperture 620*b* of the first aperture dipole 620 are arranged along is perpendicular to the second direction D2 that the third aperture 622*a* and the fourth aperture 622*b* of the second aperture dipole 622 are arranged along in the opaque plate 616 of this embodiment as compared with the fourth embodiment. As an example and not by way of limitation, when the shape of the annular aperture 118 is elliptic, the first direction D1 and the second direction D2 may be parallel to the long axis and the short axis of the elliptic annular aperture 118 respectively. Also, the first aperture 620*a*, the second aperture 620*b*, the third aperture 622*a* and the fourth aperture 622*b* are connected to the outer side 118*b* of the annular aperture 118 at their sides respectively. Furthermore, the width W1 of the first aperture 420*a* and the width W3 of the second aperture 420*b* in the first direction D1 may be larger than the width W2 of the annular aperture 118, and the width W4 of the third aperture 422*a* and the width W5 of the fourth aperture 422*b* in the second direction D2 also may be larger than the width W2 of the annular aperture 118. In this embodiment, the width W1 and the width W3 may be the same as the width W4 and the width W5. In another embodiment, the width W1 and the width W3 may be different from the width W4 and the width W5.

Figure 8:
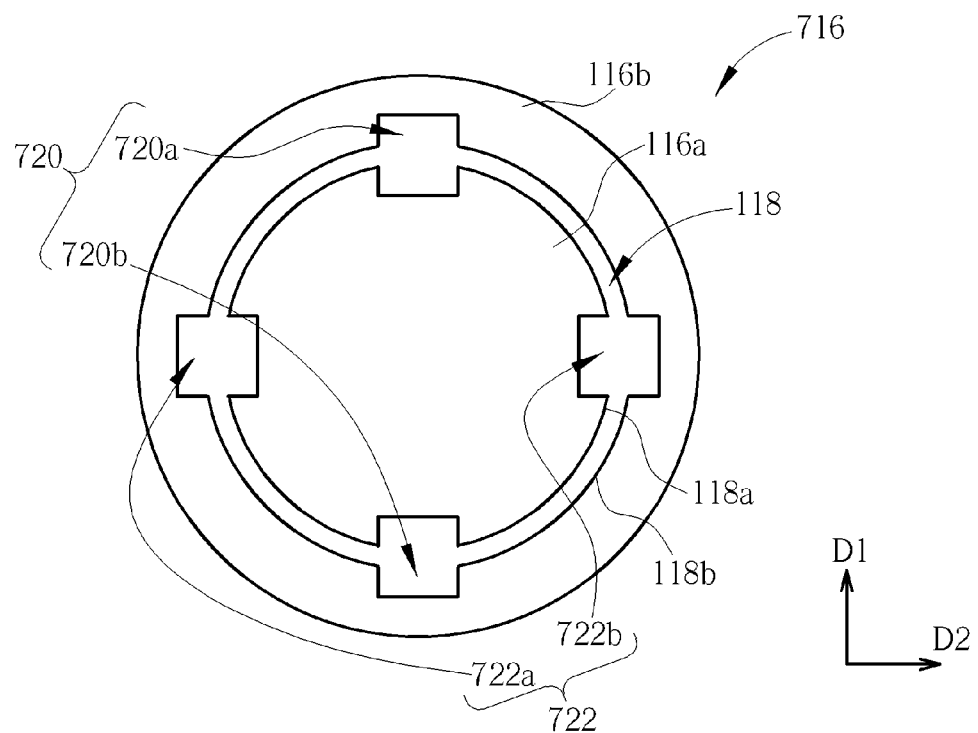
FIG. 8 illustrates a top view of an opaque plate according to a seventh embodiment of the present invention.

Refer to FIG. 8, which illustrates a top view of an opaque plate according to a seventh embodiment of the present invention. As shown in FIG. 8, each of the first aperture 720*a* and the second aperture 720*b* of the first aperture dipole 720 and the third aperture 722*a* and the fourth aperture 722*b* of the second aperture dipole 722 crosses a part of the annular aperture 118 in the opaque plate 716 of this embodiment as compared with the sixth embodiment. Similarly, in this embodiment, a part of each aperture denting toward the central portion 116*a* or protruding toward the peripheral portion 116*b* is a side but is not limited herein, and may be a corner in another embodiment. In this embodiment, the first aperture 720*a*, the second aperture 720*b*, the third aperture 722*a* and the fourth aperture 722*b* may have the same size. In another embodiment, the first aperture and the second aperture may have the same size, but have different sizes from the third aperture and the fourth aperture that have the same size.

Figure 9:
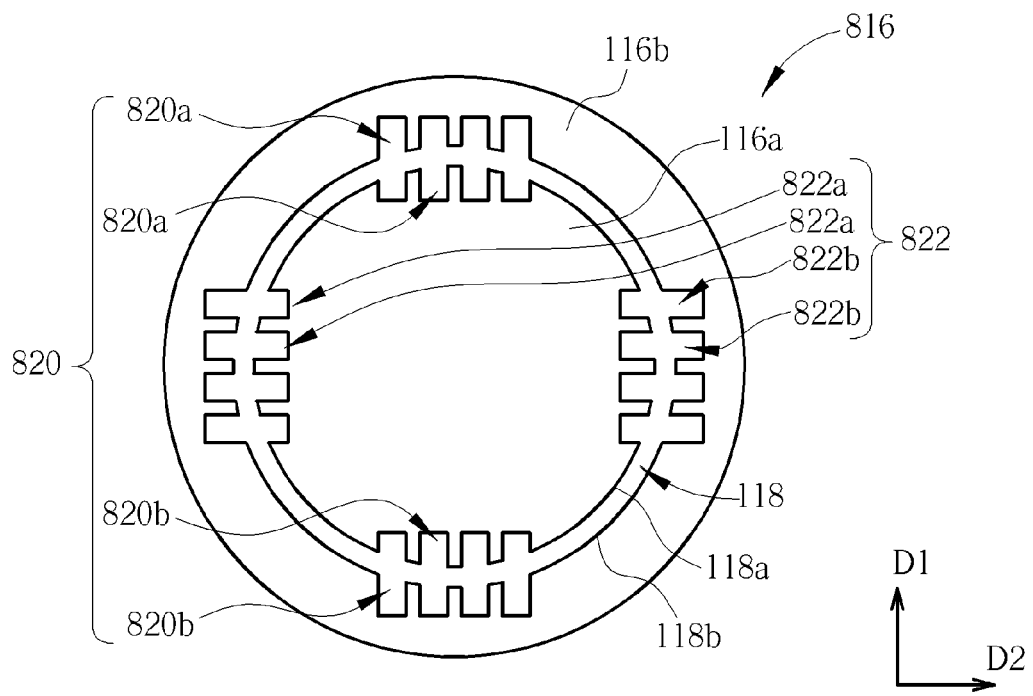
FIG. 9 illustrates a top view of an opaque plate according to an eighth embodiment of the present invention.

Refer to FIG. 9, which illustrates a top view of an opaque plate according to an eighth embodiment of the present invention. As shown in FIG. 9, the first aperture dipole 820 includes a plurality of first apertures 820*a* and a plurality of second apertures 820*b*, and the second aperture dipole 822 includes a plurality of third apertures 822*a* and a plurality of fourth aperture 822*b* in the opaque plate 816 of this embodiment as compared with the seventh embodiment. In this embodiment, the first apertures 820*a* and the second apertures 820*b* are still disposed symmetrically with respect to the center of the annular aperture 118, and each of each first aperture 820*a* and each second aperture 820*b* crosses a part of the annular aperture 118. Specifically, each of each first aperture 820*a* and each second aperture 820*b* dents from the inner side 118*a* of the annular aperture 118 toward the central portion 116*a* and protrudes out from the outer side 118*b* toward the peripheral portion 116*b*. Also, the third apertures 822*a* and the fourth apertures 822*b* are disposed symmetrically with respect to the center of the annular aperture 118, and each of each third aperture 822*a* and each fourth aperture 822*b* crosses another part of the annular aperture 118. In another embodiment, each first aperture, each second aperture, each third aperture and each fourth aperture also may only protrude a corner or a side out from the outer side of the annular aperture instead of crossing the annular aperture. In this embodiment, each first aperture 820a, each second aperture 820b, each third aperture 822a and each fourth aperture 822b may have the same size. In another embodiment, each first aperture and each second aperture may have the same size, but have different sizes from each third aperture and each fourth aperture that have the same size.

Figure 10:
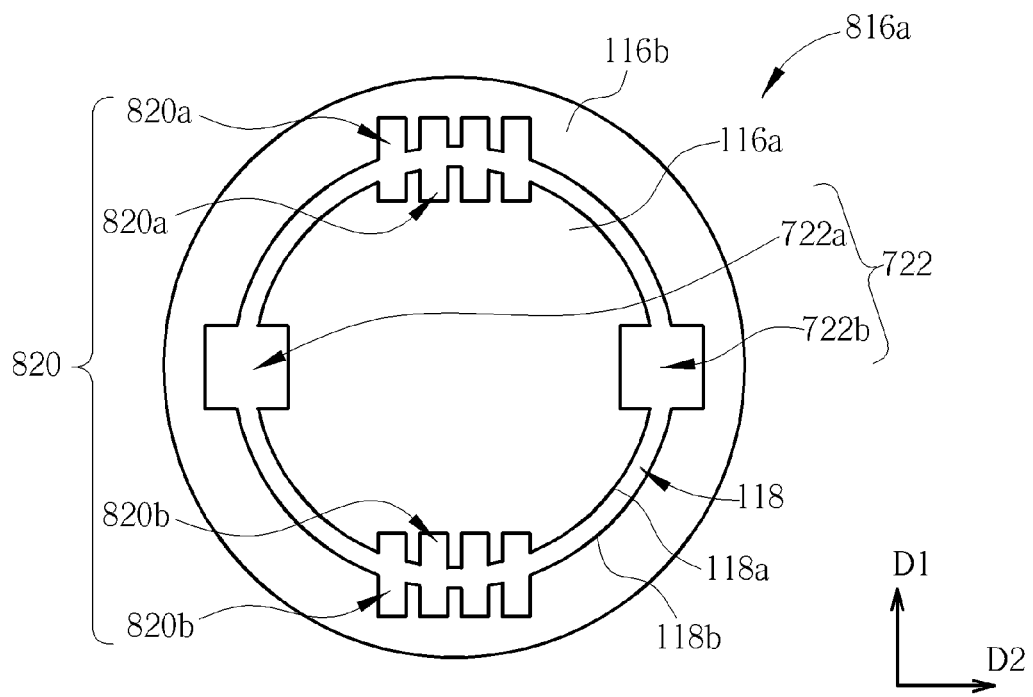
FIG. 10 illustrates a top view of an opaque plate according to a ninth embodiment of the present invention.

Refer to FIG. 10, which illustrates a top view of an opaque plate according to a ninth embodiment of the present invention. As shown in FIG. 10, only the first aperture dipole 820 includes a plurality of first apertures 820a and a plurality of second apertures 820b, and the second aperture dipole 722 still includes the single one third aperture 722a and the single one fourth aperture 722b in the opaque plate 816a of this embodiment as compared with the seventh embodiment. In this embodiment, the first apertures 820a and the second apertures 820b may have the same size, and the third aperture 722a and the fourth aperture 722b may have the same size. But, the sizes of the first apertures 820a or the second apertures 820b may be different from the size of the third aperture 722a or the fourth aperture 722b.

Figure 11:
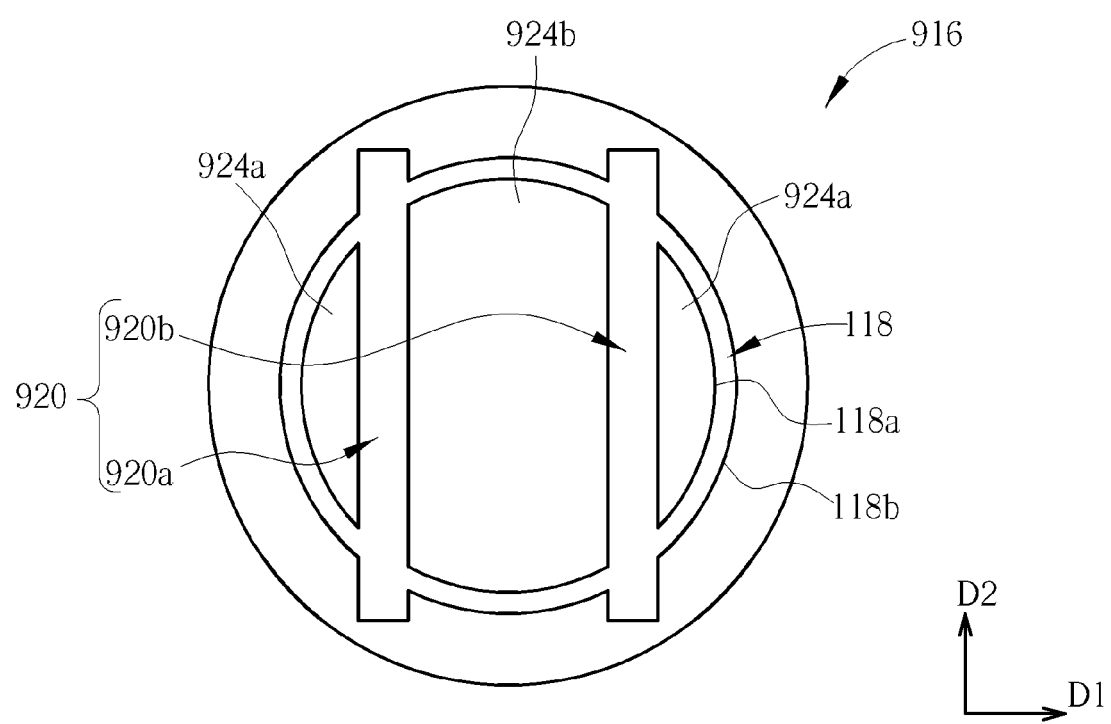
FIG. 11 illustrates a top view of an opaque plate according to a tenth embodiment of the present invention.

Refer to FIG. 11, which illustrates a top view of an opaque plate according to a tenth embodiment of the present invention. As shown in FIG. 11, the first aperture 920a and the second aperture 920b of the first aperture dipole 920 may be stripe-shaped respectively and extend along the second direction D2 to be parallel to each other in the opaque plate 916 of this embodiment as compared with the first embodiment. Also, the first aperture 920a crosses two parts of the annular aperture 118 that are not near each other, and the second aperture 920b crosses two another parts of the annular aperture 118 that are not near each other. Accordingly, the first aperture 920a and the second aperture 920b divide the central portion surrounded by the annular aperture 118 into two bow-shaped portions 924a and a stripe-shaped portion 924b. In this embodiment, the second direction D2 is parallel to the long axis of the elliptic annular aperture 118 but is not limited herein, and may be parallel to the short axis of the annular aperture in another embodiment.

Figure 12:
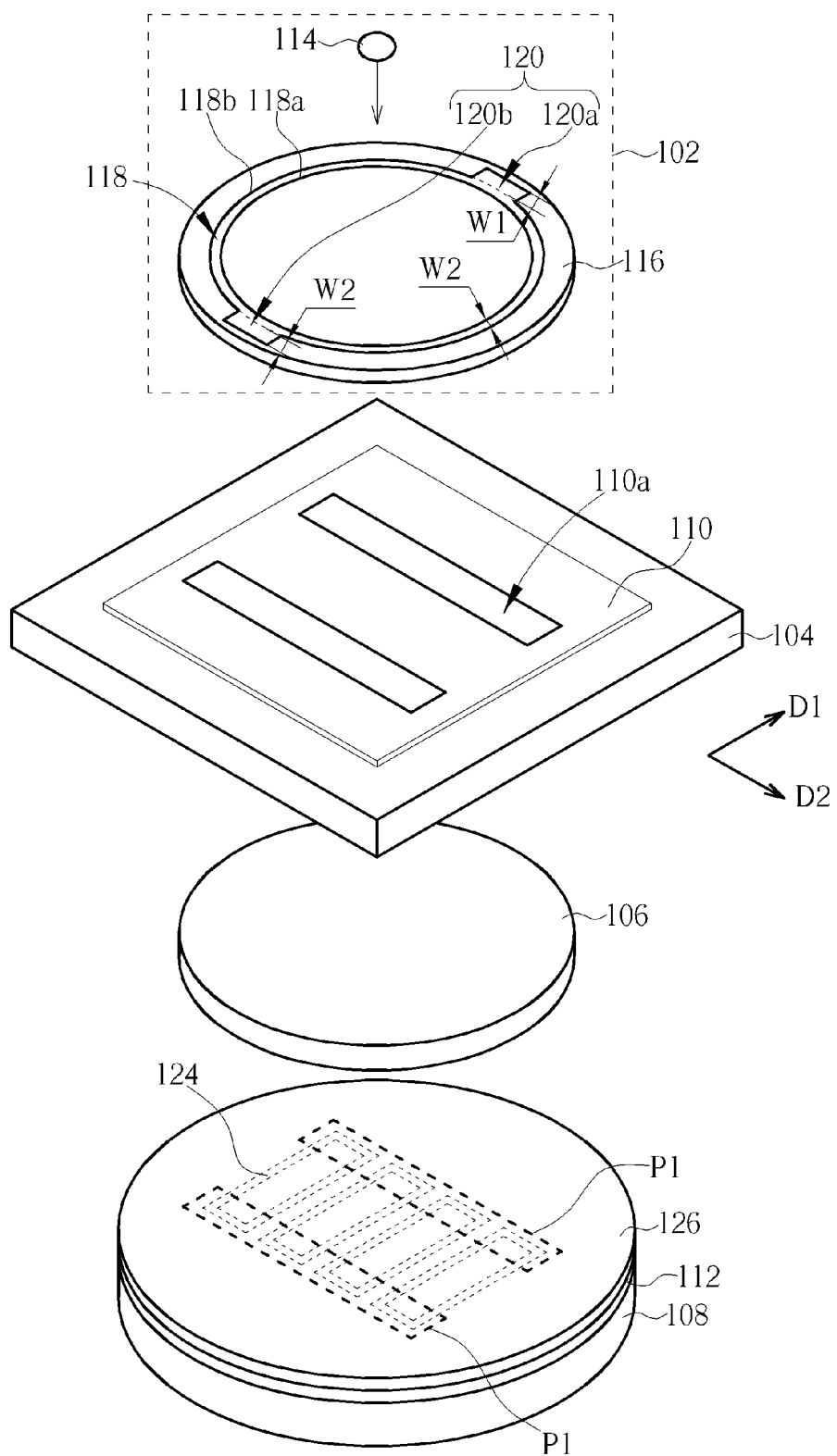
FIGS. 12 to 15 illustrate a method of forming a fin structure using the illumination system according to an embodiment of the present invention.

The present invention further provides a method of forming a fin structure using any one of the above illumination systems. In order to clearly describe how to use the illumination system, the following description uses the opaque plate of the above first embodiment as an example, but the present invention is not limited thereto. The opaque plate for forming the fin structure may applies other embodiments. Refer to FIGS. 12 to 15, which illustrate a method of forming a fin structure using the illumination system according to an embodiment of the present invention. As shown in FIG. 12, an exposure device 100 including the illumination system 102, the photomask holder 104, the projection lens 106 and the substrate holder 108 is provided first. The illumination system 102 may include the light source 114 and the opaque plate 116. The opaque plate 116 is the same as that of the first embodiment and will not be detailed redundantly.

Then, the photomask 110, a plurality of annular spacers 124 and the substrate 112 are provided while the photomask 110 is disposed between the illumination system 102 and the substrate 112, and the annular spacers 124 are disposed on the substrate 112. With this arrangement, the exposing light generated from the illumination system 102 can illuminate the annular spacers 124 on the substrate 112 through the photomask 110. Also, the photomask 110 which includes a plurality of first stripe-shaped openings 110a extending along the second direction D2 respectively can be used to define positions P1 of the first cutting openings 128. For instance, the annular spacers 124 may be formed by using a sidewall image transfer (SIT) process or a multiple sidewall image transfer process, so that the annular spacers 124 can have a width less than the CD that the exposure device can form.

Next, the opaque plate 116 of the illumination system 102 is disposed between the light source 114 and the photomask 110, and the first direction D1 is disposed to be perpendicular to the second direction D2. Subsequently, a first mask layer 126 that may include a photoresist material is formed on the annular spacers 124.

Thereafter, a first exposure process is performed with the opaque plate 116 and the photomask 110 to define the positions P1 of the first cutting openings 128 in the first mask layer 126. In this step, the first mask layer 126 include negative type photoresist material, so that the first mask layer 126 corresponding to the first stripe-shaped openings 110a of the photomask 110 is illuminated by the light, and the illuminated first mask layer 126 can define the positions P1 of the first cutting openings 128.

Figure 13:
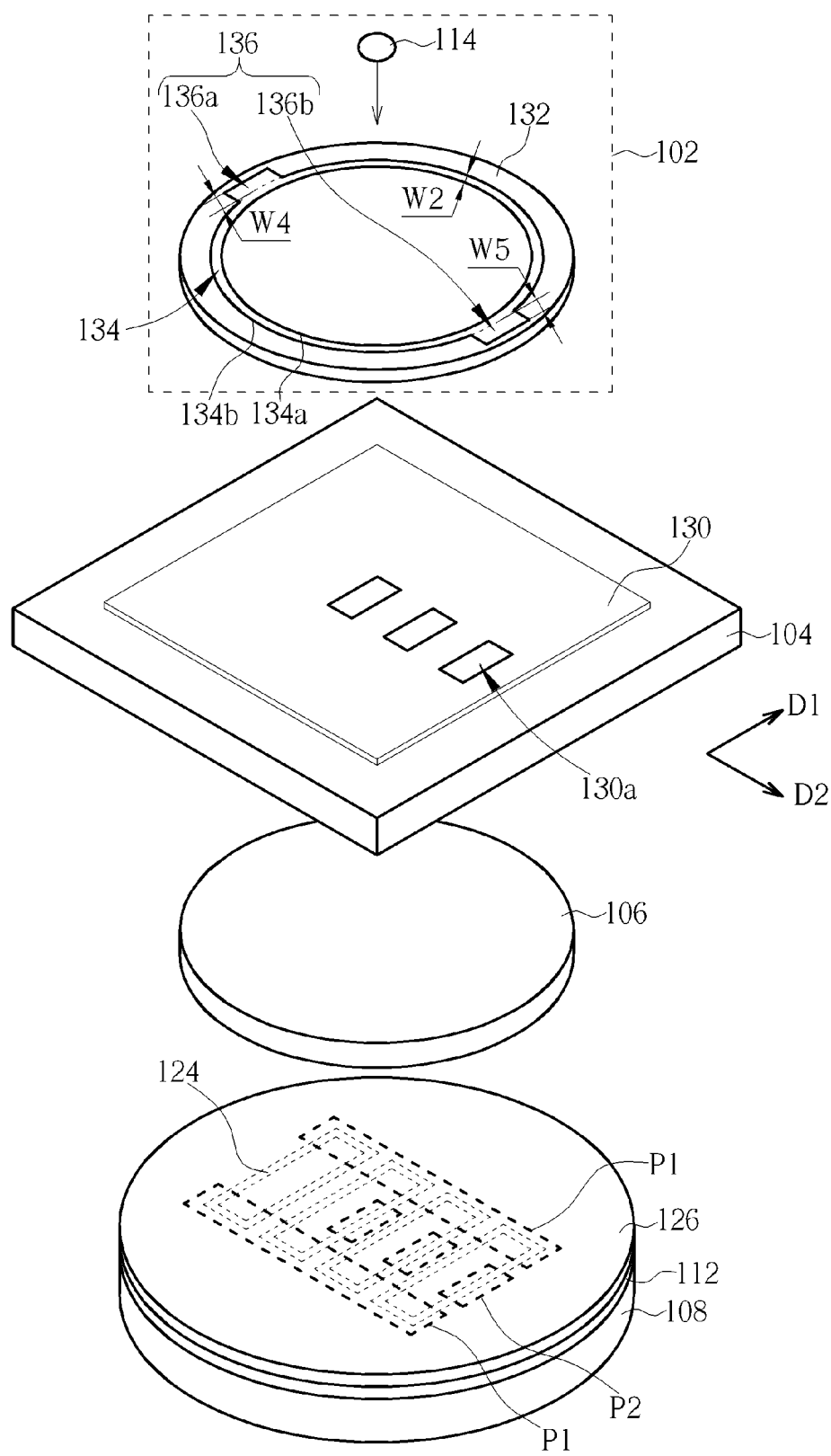

As shown in FIG. 13, after defining the positions P1 of the first cutting openings 128, another photomask 130 is provided to define the positions P2 of the second cutting openings 138, in which the photomask 130 may include a plurality of second stripe-shaped openings 130a. Also, the illumination system 102 may include another opaque plate 132 including another annular aperture 134 and a second aperture dipole 136. The annular aperture 134 has an inner side 134a and an outer side 134b. The second aperture dipole 136 includes a third aperture 136a and a fourth aperture 136b while the third aperture 136a and the fourth aperture 136b are connected to the annular aperture 134 respectively and protrude out from the outer side 134b of the annular aperture 134. The third aperture 136a and the fourth aperture 136b are disposed symmetrically with respect to the center of the annular aperture 134 and arranged along the second direction D2. In this embodiment, a width W4 of the third aperture 136a and a width W5 of the fourth aperture 136b in the second direction D2 are larger than the width W2 of the annular aperture 134.

Subsequently, the opaque plate 116 is replaced with the opaque plate 132, and the photomask 110 is replaced with the photomask 130. That is, the photomask 130 is disposed between the illumination system 102 and the substrate 112, and the opaque 132 of the illumination system 102 is disposed between the light source 114 and the photomask 130 while an extension direction of each second stripe-shaped opening 130a is disposed to be the first direction D1. After that, a second exposure process is performed with the opaque plate 132 and the photomask 130 to further define the positions P2 of the second cutting openings 138 in the first mask layer 128. The second stripe-shaped openings 130a of the photomask 130 correspond to the positions P2 of the second cutting openings 138 respectively.

Figure 14:
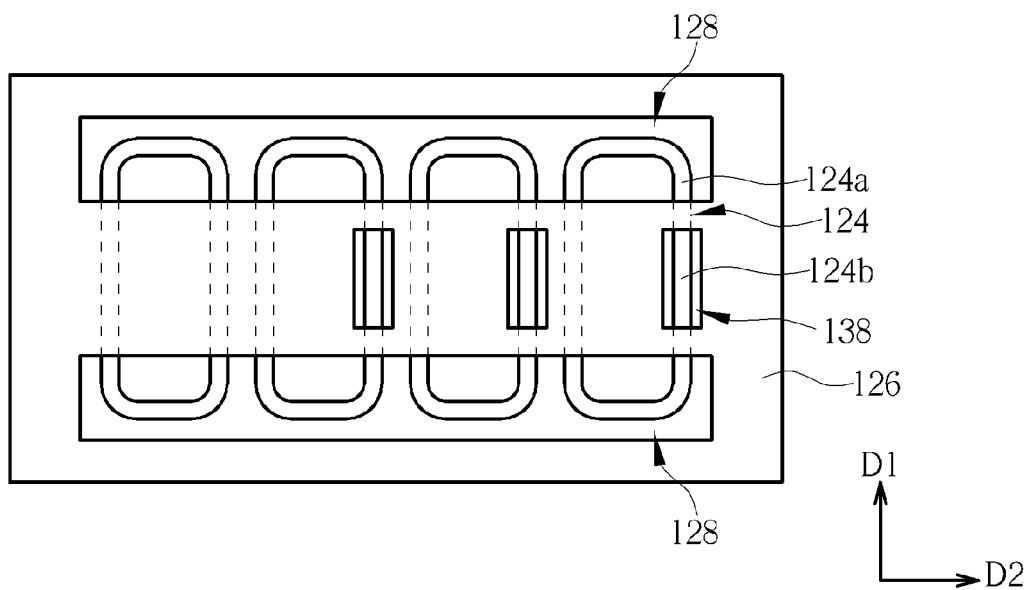

A shown in FIG. 14, after defining the positions P1 of the first cutting openings 128 and the positions P2 of the second cutting openings 138, a development process is performed to form the first cutting openings 128 exposing a plurality of first portions 124a of the annular spacers 124 respectively and the second cutting openings 138 exposing a plurality of second portions 124b of the annular spacers 124 respectively. The first cutting openings 128 and the second cutting openings 138 also can be stripe-shaped because of being defined by the first stripe-shaped openings 110a and the second stripe-shaped openings 130a respectively.

Figure 15:
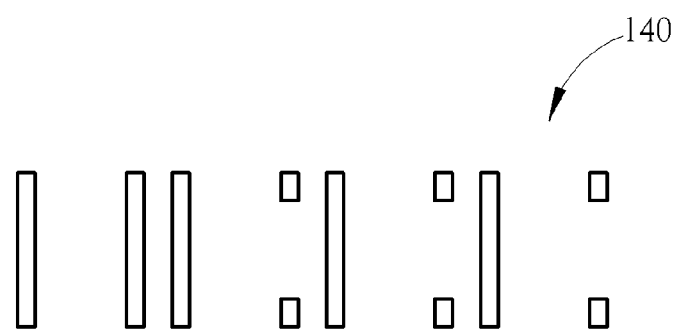

As shown in FIG. 15, an etching process is performed with using the first mask layer 126 as a mask to remove the exposed first portions 124a and the exposed second portions 124b of the annular spacers 124, thereby forming a fin structure 140. Subsequently, the first mask layer 126 may be further removed. It should be noted that the first direction D1 along which the first aperture 120a and the second aperture 120b are arranged is disposed perpendicularly to the second direction D2 along which each first stripe-shaped opening 110a extends while performing the first exposure process. Accordingly, the positions P1 of the first cutting openings 128 can be defined accurately. In other words, the arrangement direction of the first aperture 120a and the second aperture 120b of the opaque plate 116 that is the first direction D1 is preferably perpendicular to the extension direction of each first stripe-shaped opening 110a (or pattern) in the photomask 110 that is the second direction D2 when forming the first cutting openings 128 extending along the second direction D2. Similarly, in the second exposure process, the second direction D2 along which the third aperture 136a and the fourth aperture 136b are arranged is perpendicular to the first direction D1 along which each second stripe-shaped opening 130a extends, so that the positions P2 of the second cutting openings 138 can be defined accurately. Thus, the arrangement direction of the third aperture 136a and the fourth aperture 136b of the opaque plate 132 that is the second direction D2 is preferably perpendicular to the extension direction of each second stripe-shaped opening 130a (or pattern) in the photomask 130 that is the first direction D1 when forming the second cutting openings 138 extending along the first direction D1.

As the above-mentioned description, unwanted portions of the annular spacers 124 are removed by using two exposure processes and a development process to form the fin structure 140. Accordingly, the cutting openings used to cut the annular spacers 124 need to be divided into the first cutting openings 128 extending along the second direction D2 and the second cutting openings 138 extending along the first direction D1 first, and two photomasks 110, 130 used to define the first cutting openings 128 and the second cutting openings 138 respectively need to be provided. In another variant, the unwanted portions of the annular spacers may be removed by using two exposure processes and two development processes. For instance, one of the development processes may be performed right after the first exposure process to form the first cutting openings, and the exposed first portions of the annular spacers can be removed by using the first mask layer as a mask. Then, the first mask layer is removed, and a second mask layer is formed on the annular spacers. After that, a second exposure process and a second development process are performed by using the opaque plate 132 and the photomask 130 to form a plurality of second cutting openings in the second mask layer and expose the second portions of the annular spacers. Subsequently, the exposed second portions of the annular spacers are removed by using the second mask layer as a mask to form the fin structure.

In another embodiment, the opaque plate also can apply any one of the opaque plates of the above fourth to ninth embodiments, which has the first aperture and second aperture arranged along the first direction and the third aperture and the fourth aperture arranged along the second direction. Thus, the first cutting openings and the second cutting openings can be accurately defined and formed in the first mask layer by the same exposure process performed with a photomask that integrates the first stripe-shaped openings with the second stripe-shape openings. In this case, the annular spacers only need one exposure process and one development process to remove unwanted portions. Besides, when the shape of the annular aperture is elliptic combined with the first aperture and the second aperture being arranged along a direction parallel to the long axis and the third aperture and the fourth aperture being arranged along a direction parallel to the short axis, the photomask preferably has more number of or more dense arrangement of the first stripe-shaped openings extending along the long axis and less number of or more sparse arrangement of the second stripe-shaped openings extending along the short axis.

In the opaque plate of the present invention, the aperture dipole at least is disposed at the outer side of the annular aperture, so that the incident angle of the exposing light to the photomask after passing through the aperture dipole and the annular aperture can be increased, and the CD can be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An illumination system, comprising:
   a light source used to generate a light; and
   an opaque plate disposed between the light source and a photomask, the opaque plate comprising:
      an annular aperture having an inner side and an outer side; and
      a first aperture dipole comprising at least one first aperture and at least one second aperture, wherein the first aperture and the second aperture are connected to the annular aperture respectively and protrude out from the outer side of the annular aperture, the first aperture and the second aperture are disposed symmetrically with respect to a center of the annular aperture, the first aperture dipole comprises a plurality of first apertures and a plurality of second apertures, the first apertures and the second apertures are disposed symmetrically with respect to the center of the annular aperture, and each of each first aperture and each second aperture crosses a part of the annular aperture respectively.

2. The illumination system according to claim 1, wherein the first apertures and the second apertures are arranged along a first direction, and a width of each first aperture and a width of each second aperture in the first direction are larger than a width of the annular aperture.

3. The illumination system according to claim 1, wherein the opaque plate further comprises a second aperture dipole comprising a third aperture and a fourth aperture, wherein the third aperture and the fourth aperture are connected to the annular aperture respectively and protrude out from the outer side of the annular aperture, and the third aperture and the fourth aperture are disposed symmetrically with respect to the center of the annular aperture.

4. The illumination system according to claim 3, wherein the third aperture and the fourth aperture are arranged along a second direction, and a width of the third aperture and a width of the fourth aperture in the second direction are larger than a width of the annular aperture.

5. The illumination system according to claim 3, wherein each of the third aperture and the fourth aperture crosses a part of the annular aperture respectively.

6. The illumination system according to claim 3, wherein the first apertures and the second apertures are arranged along a first direction, and the third aperture and the fourth aperture are arranged along a second direction perpendicular to the first direction.

7. The illumination system according to claim 1, wherein the opaque plate further comprises a second aperture dipole comprising a plurality of third apertures and a plurality of fourth apertures, wherein the third apertures and the fourth apertures are disposed symmetrically with respect to the center of the annular aperture, wherein each of each third aperture and each fourth aperture crosses another part of the annular aperture respectively.

8. A method of forming a fin structure using an illumination system, comprising:
  providing the illumination system, wherein the illumination system comprises:
    a light source used to generate a light; and
    a first opaque plate comprising:
      a first annular aperture having a first inner side and a first outer side; and
      a first aperture dipole comprising a plurality of first apertures and a plurality of second apertures, wherein the first apertures and the second apertures are connected to the first annular aperture respectively and protrude out from the first outer side of the first annular aperture, the first apertures and the second apertures are disposed symmetrically with respect to a first center of the first annular aperture and arranged along a first direction, and each of each first aperture and each second aperture crosses a part of the first annular aperture respectively;
  providing a first photomask, a plurality of annular spacers and a substrate, wherein the annular spacers are disposed on the substrate, and the first photomask comprises a plurality of first stripe-shaped openings extending along a second direction respectively;
  disposing the first opaque plate of the illumination system between the light source and the first photomask and disposing the first direction to be perpendicular to the second direction;
  forming a first mask layer on the annular spacers; and
  performing a first exposure process with the illumination system and the first photomask to define positions of a plurality of first cutting openings in the first mask layer.

9. The method of forming the fin structure using the illumination system according to claim 8, wherein a width of each first aperture and a width of each second aperture in the first direction are larger than a width of the first annular aperture.

10. The method of forming the fin structure using the illumination system according to claim 8, further comprising:
  providing a second photomask comprising a plurality of second stripe-shaped openings, wherein the illumination system further comprises a second opaque plate comprising:
    a second annular aperture having a second inner side and a second outer side; and
    a second aperture dipole comprising a third aperture and a fourth aperture, wherein the third aperture and the fourth aperture are connected to the second annular aperture respectively and protrude out from the second outer side of the second annular aperture, and the third aperture and the fourth aperture are disposed symmetrically with respect to a second center of the second annular aperture and arranged along the second direction;
  replacing the first opaque plate with the second opaque plate, replacing the first photomask with the second photomask, and disposing an extension direction of each second stripe-shaped opening to be the first direction;
  performing a second exposure process with the illumination system and the second photomask to define positions of a plurality of second cutting openings in the first mask layer;
  performing a development process to form the first cutting openings and the second cutting openings, wherein the first cutting openings expose a plurality of first portions of the annular spacers respectively, and the second cutting openings expose a plurality of second portions of the annular spacers respectively; and
  removing the first portions and the second portions of the annular spacers to form the fin structure by using the first mask layer as a mask.

11. The method of forming the fin structure using the illumination system according to claim 10, wherein a width of the third aperture and a width of the fourth aperture in the second direction are larger than a width of the second annular aperture.

12. The method of forming the fin structure using the illumination system according to claim 8, wherein the first opaque plate further comprises a second aperture dipole comprises a third aperture and a fourth aperture, wherein the third aperture and the fourth aperture are connected to the first annular aperture respectively and protrude out from the first outer side of the first annular aperture, and the third aperture and the fourth aperture are disposed symmetrically with respect to the first center of the first annular aperture, wherein the third aperture and the fourth aperture are arranged along the second direction, and the first photomask further comprises a plurality of second stripe-shaped openings extending along the second direction respectively.

13. The method of forming the fin structure using the illumination system according to claim 12, wherein each of the third aperture and the fourth aperture crosses a part of the first annular aperture respectively.

14. The method of forming the fin structure using the illumination system according to claim 8, wherein the first opaque plate further comprises a second aperture dipole comprising a plurality of third apertures and a plurality of fourth apertures, wherein the third apertures and the fourth apertures are disposed symmetrically with respect to the first center of the first annular aperture, and each of each third aperture and each fourth aperture crosses another part of the first annular aperture respectively.

15. An illumination system, comprising:
  a light source used to generate a light; and
  an opaque plate disposed between the light source and a photomask, the opaque plate comprising:
    an annular aperture having an inner side and an outer side; and
    a first aperture dipole comprising at least one first aperture and at least one second aperture, wherein the first aperture and the second aperture are connected to the annular aperture respectively and protrude out from the outer side of the annular aperture, the first aperture and the second aperture are disposed symmetrically with respect to a center of the annular aperture, the first aperture and the second aperture are stripe-shaped and parallel to each other, and the first aperture crosses two parts of the annular aperture, and the second aperture crosses two another parts of the annular aperture.

16. A method of forming a fin structure using an illumination system, comprising:

providing the illumination system, wherein the illumination system comprises:
- a light source used to generate a light; and
- a first opaque plate comprising:
  - a first annular aperture having a first inner side and a first outer side; and
  - a first aperture dipole comprising at least one first aperture and at least one second aperture, wherein the first aperture and the second aperture are connected to the first annular aperture respectively and protrude out from the first outer side of the first annular aperture, the first aperture and the second aperture are disposed symmetrically with respect to a first center of the first annular aperture and arranged along a first direction, the first aperture and the second aperture are stripe-shaped and parallel to each other, the first aperture crosses two parts of the first annular aperture, and the second aperture crosses two another parts of the first annular aperture;

providing a first photomask, a plurality of annular spacers and a substrate, wherein the annular spacers are disposed on the substrate, and the first photomask comprises a plurality of first stripe-shaped openings extending along a second direction respectively;

disposing the first opaque plate of the illumination system between the light source and the first photomask and disposing the first direction to be perpendicular to the second direction;

forming a first mask layer on the annular spacers; and performing a first exposure process with the illumination system and the first photomask to define positions of a plurality of first cutting openings in the first mask layer.

* * * * *